(12) United States Patent
Cinnor et al.

(10) Patent No.: US 8,980,757 B2
(45) Date of Patent: Mar. 17, 2015

(54) METHODS FOR SINGLE EXPOSURE—SELF-ALIGNED DOUBLE, TRIPLE, AND QUADRUPLE PATTERNING

(75) Inventors: Fitih M. Cinnor, Hillsboro, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 13/993,659

(22) PCT Filed: Dec. 15, 2011

(86) PCT No.: PCT/US2011/065079
§ 371 (c)(1),
(2), (4) Date: Jun. 12, 2013

(87) PCT Pub. No.: WO2013/089727
PCT Pub. Date: Jun. 20, 2013

(65) Prior Publication Data
US 2014/0073137 A1   Mar. 13, 2014

(51) Int. Cl.
*H01L 21/00* (2006.01)
*H01L 21/308* (2006.01)
*H01L 21/027* (2006.01)
*H01L 21/033* (2006.01)
*H01L 21/311* (2006.01)

(52) U.S. Cl.
CPC ........ *H01L 21/3088* (2013.01); *H01L 21/0272* (2013.01); *H01L 21/0273* (2013.01); *H01L 21/0337* (2013.01); *H01L 21/0338* (2013.01); *H01L 21/31144* (2013.01)
USPC ....................................................... 438/703

(58) Field of Classification Search
None
See application file for complete search history.

(56) References Cited

U.S. PATENT DOCUMENTS

| 7,732,338 | B2 | 6/2010 | Narita |
| 8,786,833 | B2 * | 7/2014 | Nikolsky et al. ................ 355/77 |
| 8,802,566 | B2 * | 8/2014 | Popp et al. ..................... 438/671 |
| 8,819,904 | B2 * | 9/2014 | Gorisse et al. ............... 29/25.35 |
| 2005/0064622 | A1 * | 3/2005 | Atobe et al. .................... 438/69 |
| 2013/0214391 | A1 * | 8/2013 | Choi et al. .................... 257/622 |
| 2014/0045341 | A1 * | 2/2014 | Yonemitsu .................... 438/763 |

FOREIGN PATENT DOCUMENTS

| JP | 2005129702 | 5/2005 |
| JP | 2007005377 | 1/2007 |

(Continued)

OTHER PUBLICATIONS

Intel Corporation, et al., The International Search Report and the Written Opinion, dated Aug. 17, 2012 for PCT/US2011/065079.

(Continued)

*Primary Examiner* — Charles Garber
*Assistant Examiner* — Evren Seven
(74) *Attorney, Agent, or Firm* — Blakely, Sokoloff, Taylor & Zafman LLP

(57) ABSTRACT

A method including forming a pattern on a surface of a substrate, the pattern including one of discrete structures including at least one sidewall defining an oblique angle relative to the surface and discrete structures complemented with a material layer therebetween, the material layer including a volume modified into distinct regions separated by at least one oblique angle relative to the surface; and defining circuit features on the substrate using the pattern, the features having a pitch less than a pitch of the pattern.

10 Claims, 16 Drawing Sheets

(56) References Cited

FOREIGN PATENT DOCUMENTS

| | | |
|---|---|---|
| KR | 1020070088248 | 8/2007 |
| TW | 2005129702 | 5/2005 |

OTHER PUBLICATIONS

Intel Corporation et al., Taiwan Office Action dated Oct. 16, 2014 for TW Application No. 101144001.

* cited by examiner

METHODS FOR SINGLE EXPOSURE—SELF-ALIGNED DOUBLE, TRIPLE, AND QUADRUPLE PATTERNING

CROSS-REFERENCE TO RELATED APPLICATION

This patent application is a U.S. National Phase Application under 35 U.S.C. §371 of International Application No. PCT/US2011/065079, filed Dec. 15, 2011, entitled METHODS FOR SINGLE EXPOSURE—SELF-ALIGNED DOUBLE, TRIPLE, AND QUADRUPLE PATTERNING.

BACKGROUND

Multiple patterning refers to technologies developed for photolithography to enhance the feature density. In double patterning, a lithography process is enhanced to produce double the expected number of features. Techniques to achieve double patterning include a lithography-etch, lithography-etch approach that requires, as the name suggests, two exposures and two etch operations. A second technique is a lithography-freeze technique that requires only one etch operation and uses a chemical modification process to 'freeze' the exposed/developed resist before undergoing a second resist coat and exposure step. Because the freeze uses a chemical modification of the first exposed/developed resist, it is not adversely affected by subsequent lithography processing. Although requiring only a single etch operation, like the lithography-etch, lithography-etch technique, the lithography-freeze technique requires two exposures. Another approach is the usage of spacer-based patterning, which, although using a single exposure, involves multiple processing steps.

DETAILED DESCRIPTION

Methods to define integrated circuit features generally involving a single exposure to define a primary pattern are disclosed. The primary pattern is either maintained or transferred into another material before proceeding to subsequent processing. This pattern may be used to directly define a self-aligned double, triple or quadruple pattern by utilizing intentionally introduced angular surfaces and volume modification methods to create differentiated components consisting of modified and unmodified regions. The introduced angular surface or volume modification methods are used for division of a primary pattern pitch.

Figure 1:
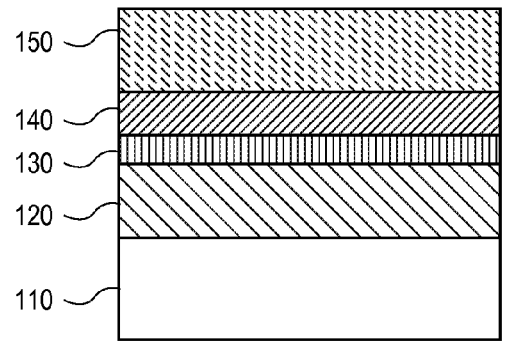
FIG. 1 shows a side view of an embodiment of a portion of an integrated circuit structure including a base substrate, a hard mask layer, first and second substrate layers and a photoresist layer.

FIG. 1 shows the embodiment of a portion of an integrated circuit structure. Such structure may be a portion of a wafer that is designated for hundreds of discreet integrated circuit chips. FIG. 1 shows the structure including substrate 110 of, for example, a semiconductor material such as silicon. Overlying a surface (top surface as viewed) of substrate 110 is hard mask layer 120. In one embodiment, hard mask layer 120 is, for example, a silicon nitride ($Si_xN_y$) or a similar material. Overlying a surface of hard mask layer 120 is first substrate layer 130 of, for example, a first antireflective material. Overlying a surface of first substrate layer 130 is second substrate 140 of, for example, a second antireflective material having, in one embodiment, etch characteristics different than a material for substrate layer 130. Both first substrate layer 130 and second substrate layer 140 are each selected to be materials that have selectivity with respect to each other and with respect to hard mask layer 120. It is appreciated that etch properties of many materials known for use in integrated circuit processing, including antireflective materials, are known as are their methods of deposition. Overlying second substrate layer 140 is photoresist layer 150. Photoresist layer 150 may be a positive or negative photoresist.

Figure 2:
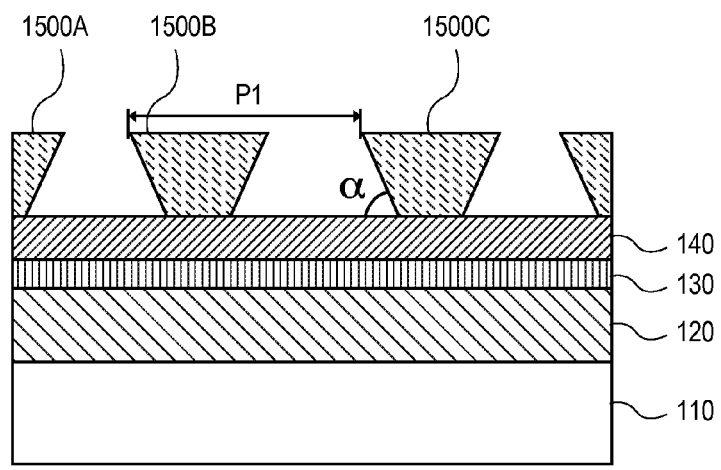
FIG. 2 shows the structure of FIG. 1 following the patterning of the photoresist layer into discreet structures with opposing side walls, each defining an oblique angle less than 90° with a surface of an underlying substrate layer.

FIG. 2 shows the structure of FIG. 1 following patterning of photoresist layer 150. In FIG. 2, photoresist layer 150 is patterned into discreet structures 1500A, 1500B and 1500C. It is appreciated that the representation of a few discreet structures is for illustration purposes only. Each of the discreet structures is patterned to have opposing side walls each defining an oblique angle, a, relative to the surface of a second substrate layer 140. In FIG. 2, the oblique angles of each side wall have an angle less than 90 degrees relative to the surface. A representative angle, α, is on the order of 45° As illustrated, the discreet structures of photoresist material have a length dimension that, in this representation, goes into the page. The opposing side walls reduce a base of the width dimension of a discreet structure relative to a width of the top or summit of the structures. In this manner, discreet structures 1500A, 1500B and 1500C resemble inverted isosceles trapezoid prisms. The oblique angles may be formed by photolithography techniques, such as by exposing photographic layer 150 to a light source through a reticle that creates the oblique angle pattern. FIG. 2 also shows that the discreet structures 1500A, 1500B and 1500C are patterned at a pitch $P_1$ measured between a top edge of the pattern (e.g., the widest portion of the discreet structure).

Figure 3:
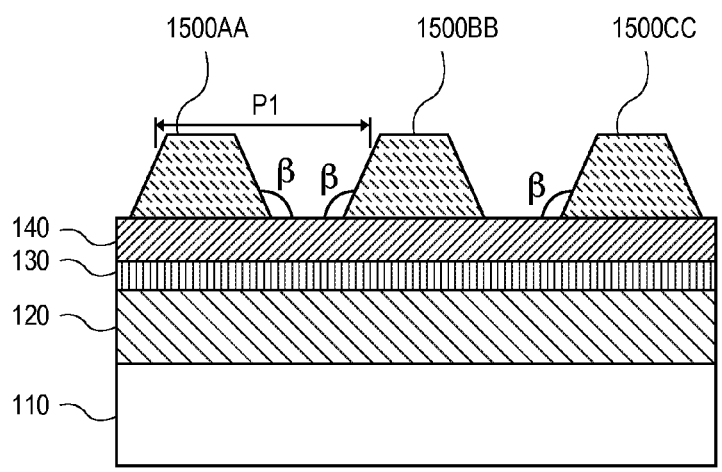
FIG. 3 shows a side view of another embodiment of a portion of an integrated circuit structure where discreet structures are formed from a photoresist layer and each discreet structure includes opposing side walls that each define an oblique angle greater than 90° with a surface of an underlying substrate layer.
Figure 4:
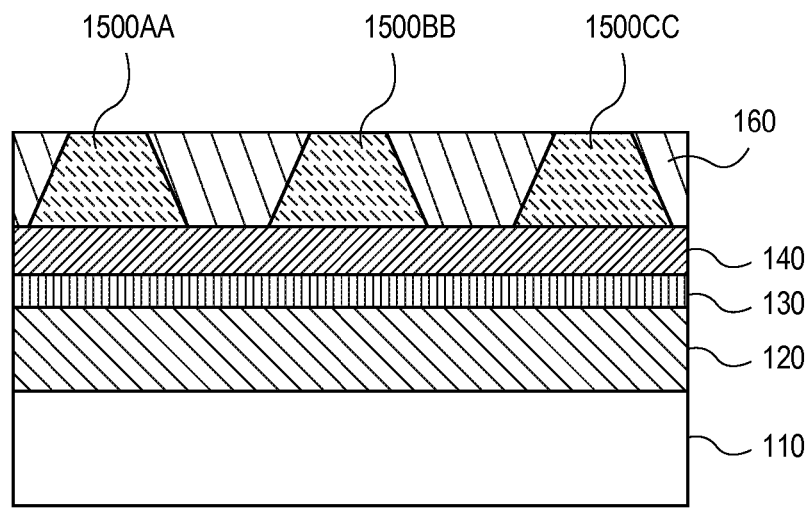
FIG. 4 shows the structure of FIG. 3 following introduction of a protective layer in a complementary fashion on the surface of the structure.
Figure 5:
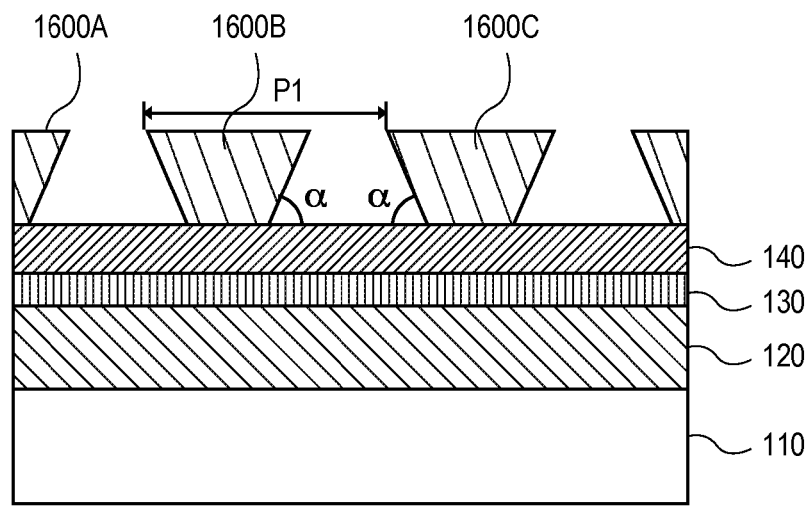
FIG. 5 shows the structure of FIG. 4 following the formation of discreet structures of protective layer material and the removal of the discreet structures of photoresist material.

It is appreciated that forming discreet structures such as discreet structure 1500A, 1500B and 1500C may be accomplished in a number of ways. FIGS. 3-5 show one alternative technique initially where having opposing side walls each with an oblique angle structures 1500AA, 1500BB, and 1050CC are formed from photoresist layer 150 each having an oblique angle, β, relative to the surface of second substrate layer 140. In this embodiment, the oblique angle of the opposing side walls is opposite oblique angle, α, described in FIG. 2 for structures 1500A, 1500B and 1500C. Opposing side walls of structures 1500AA, 1500BB and 1500CC each define an angle, β, greater than 90 degrees with respect to the surface. A representative angle, β, is on the order of 135°.

Following the formation of discreet structures 1500AA, 1500BB and 1500CC, a protective layer (of, for example, a silicon nitride layer) may be deposited on a surface of the structure. In FIG. 4, there is shown the structure having protective layer 160 deposited in a complementary fashion; complementary in the sense that protective layer 160 complements or completes in a sense a layer on surface of the structure with discreet photoresist structures 1500AA, 1500BB and 1500CC. Once protective layer 160 is formed on the structure, the layer may be planarized by, for example, a polish. Photoresist structures 1500AA, 1500BB and 1500CC are then removed leaving the protective layer as the material on the surface of the substrate. FIG. 5 shows the structure having discreet structure 1600A, 1600B and 1600C of protective layer material on a surface of the structure. FIG. 5 shows that the discreet structures include opposing side walls that each define an angle, $\alpha$, relative to the surface of the structure that is less than 90° (e.g., 45°). The discreet structures also have a pitch, P1 that is the same pitch as the pitch formed by discreet structures 1500AA, 1500BB, and 1500CC of photoresist material in FIG. 3.

Figure 6:
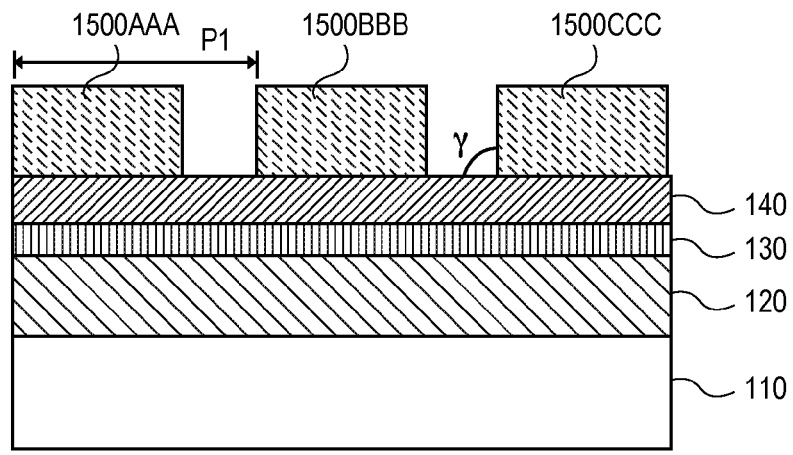
FIG. 6 shows a side view of another embodiment of a portion of an integrated circuit structure including a base substrate, a hard mask layer, first and second substrate layers and photoresist material patterned into the discreet structures each with opposing side walls that are parallel to one another an perpendicular with a surface of an underlying substrate layer.
Figure 7:
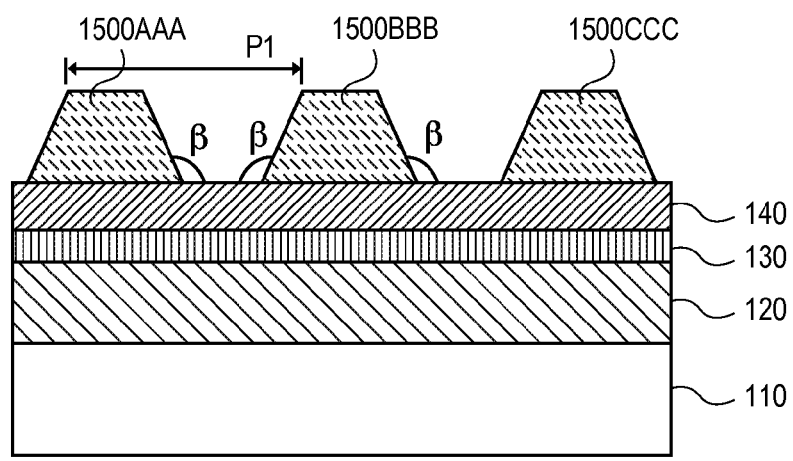
FIG. 7 shows the structure of FIG. 6 following the patterning of the discreet structures of photoresist material into structures having opposing side walls that each define an oblique angle greater than 90° with a surface of an underlying substrate layer.

In the above description with reference to FIG. 3, angled side wall patterning of a photoresist was described to produce discreet structures having opposing oblique side walls with an angle, $\beta$, greater than 90 degrees. One way to form such discreet structures with oblique angled side walls is through isotropic etching techniques (e.g., a wet etch). In another embodiment, such discreet side wall structures can be formed in a two operation process. Referring to FIG. 6, initially a photoresist may be patterned to define structures with parallel opposing side walls using, for example, an anisotropic etch technique. FIG. 6 shows discreet structures 1500AAA, 1500BBB and 1500CCC. Each structure has opposing perpendicular side walls relative to a surface of the second substrate layer 140. Such perpendicular side walls are represented by angle, $\alpha$, of 90 degrees. A pitch from a top edge of each discreet structure to the similar edge of an adjacent discreet structure is represented by P1. Following the formation of discreet structures 1500AAA, 1500BBB and 1500CCC, each structure may be etched isotropically to form the desired oblique angled opposing side wall surfaces relative to the surface of the substrate as shown in FIG. 7. An isotropic etch may be done in such a way to maintain the pitch, P1, between a top edge of one discreet structure and the same edge of an adjacent discreet structure.

Figure 8:
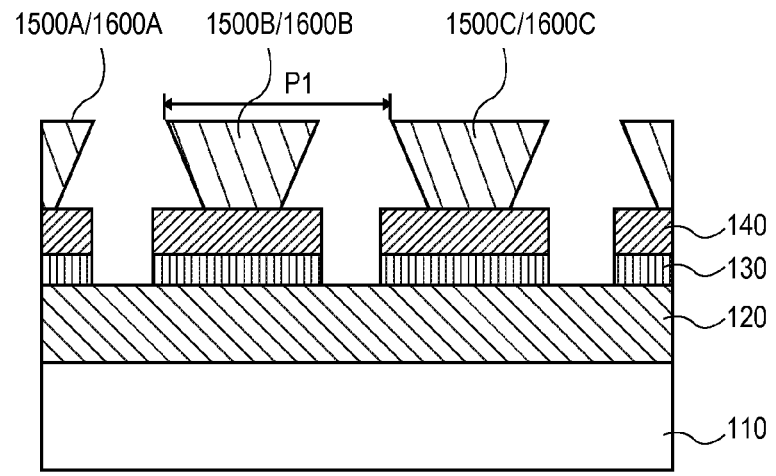
FIG. 8 shows the structure of FIG. 2 or FIG. 5 following an anisotropic etch through substrate layers to hard mark layer.
Figure 9:
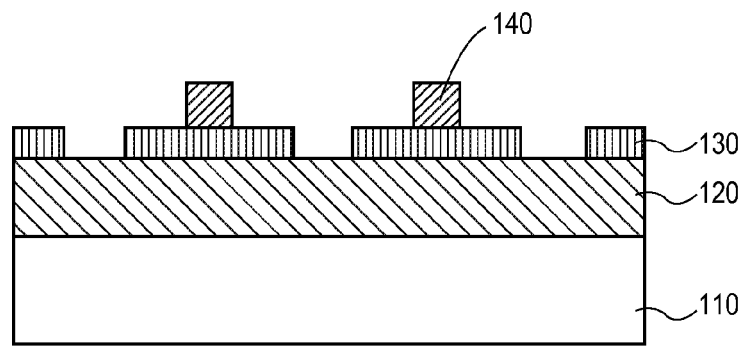
FIG. 9 shows the structure of FIG. 8 following an isotropic etch using the discreet structures of photoresist material as a pattern followed by a removal of the discreet structures.

Following the formation of discreet structures on a substrate having oblique opposing side wall angles (discreet structures 1500A, 1500B and 1500C of FIG. 2 of photoresist material or discreet structures 1600A, 1600B and 1600C of FIG. 5 of a protective layer material). The pattern may be used to define a pattern in the composite structure (the composite structure in this sense constituting a combination of substrate 110, hard mask layer 120, substrate layer 130 and substrate layer 140). In an initial etch, the structure may be etched anisotropically with, for example, a plasma etch, using the discreet structures as a pattern. FIG. 8 shows an anisotropic etch through second substrate layer 140 and first substrate layer 130 to hard mask layer 120 (e.g. hard mask layer 120 serves an etch stop). Thus, in one embodiment, an etch chemistry for the anisotropic etch is selected to have an etch chemistry selective for a material of first substrate layer 130 and second substrate layer 140 relative to a material for hard mask layer. The anisotropic etch may be followed by an isotropic etch selective for second substrate layer 140 relative first substrate layer 130. FIG. 9 shows the structure following the isotropic etch using the discreet structures as a pattern.

Figure 10:
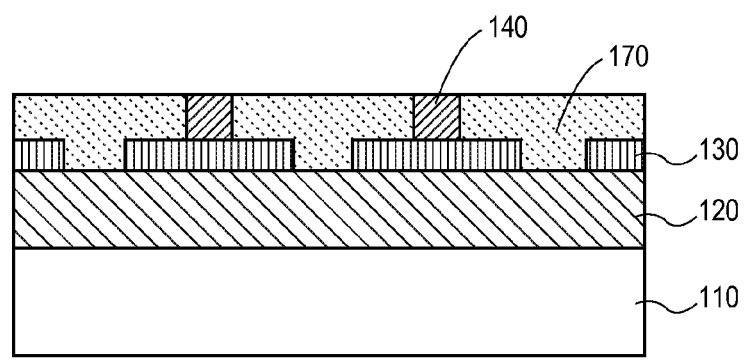
FIG. 10 shows the structure of FIG. 9 following a deposition of a protective layer on the structure complementary to the first and second substrate layers.
Figure 11:
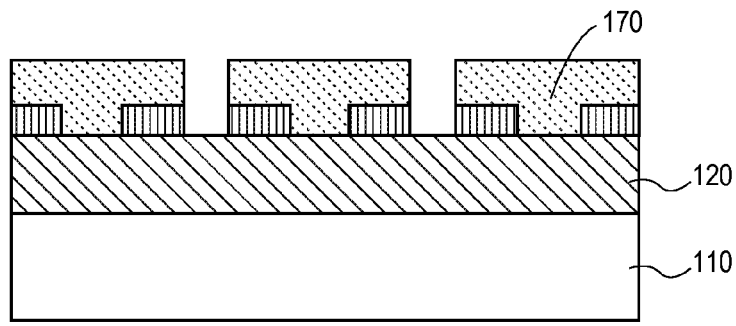
FIG. 11 shows the structure of FIG. 10 following an etch to remove the second substrate layer and pattern the protective layers into discreet structures.

FIG. 10 shows the structure following a deposition of a protective layer on a surface of the structure. Protective layer 170 is deposited over the surface of the substrate in a complementary fashion to both openings in first substrate layer 130 and second substrate layer 140 (complementary in the sense that protective layer 170 complements or completes a layer on the structure with the patterned structures of first substrate layer 130 and second substrate layer 140). Protective layer 170 is, for example, silicon oxide. Protective layer 170 is formed such that portions of patterned substrate layer 140 are exposed. This may be accomplished by depositing substrate layer 170 so that superior portions (as viewed) of patterned second substrate layer 140 remain exposed or the substrate may be polished or etched following the deposition of protective layer 170 to expose patterned second substrate layer 140. Following the deposition and any patterning of protective layer 170, an etch is performed to remove patterned second substrate layer 140 and a portion of patterned first substrate layer 130 underlying patterned second substrate layer 140 as shown in FIG. 11.

Figure 12:
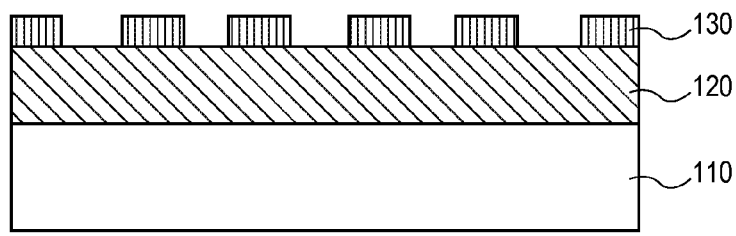
FIG. 12 shows the structure of FIG. 11 following the removal of a protective layer.
Figure 13:
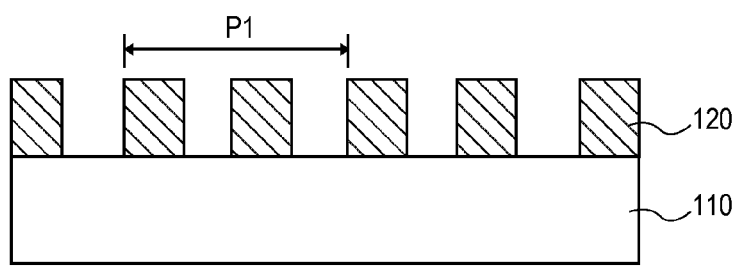
FIG. 13 shows the structure of FIG. 12 following the patterning of a hard mask layer with the patterned first substrate layer and removal of the first substrate layer.

FIG. 12 shows the structure following the removal of protective layer 170 and FIG. 13 shows the structure following the patterning of hard mask layer 120 with patterned first substrate layer 130. In FIG. 13, patterned first substrate layer 130 is removed.

Figure 14:
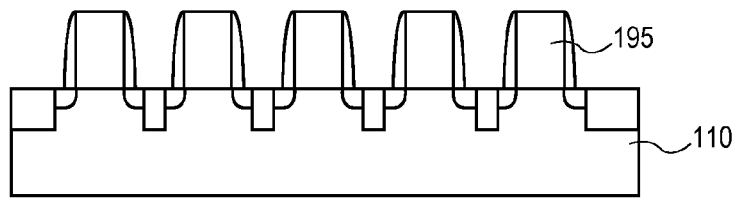
FIG. 14 shows a representative embodiment where the pattern defined by the patterned hard mask layer in FIG. 13 was used to form transistor electrodes on a substrate as part of an integrated circuit.

As shown in FIG. 13, the pitch of discreet structures of patterned hard mask layer 120 is twice that of the initial pitch of the pattern mask, P1. Hard mask layer 120 may be used as a pattern to form discreet structures on substrate 110. FIG. 14 shows a representative embodiment where the pattern defined by patterned hard mask layer 120 is used to form transistor electrodes 195 on substrate 110 as part of an integrated circuit. It is appreciated that other devices (e.g., resistors, capacitors) may alternatively or additionally be formed using the pattern. Alternatively, the pattern may be used to define active areas of a substrate, for example, by defining isolation or diffusion areas in substrate 110.

Figure 15:
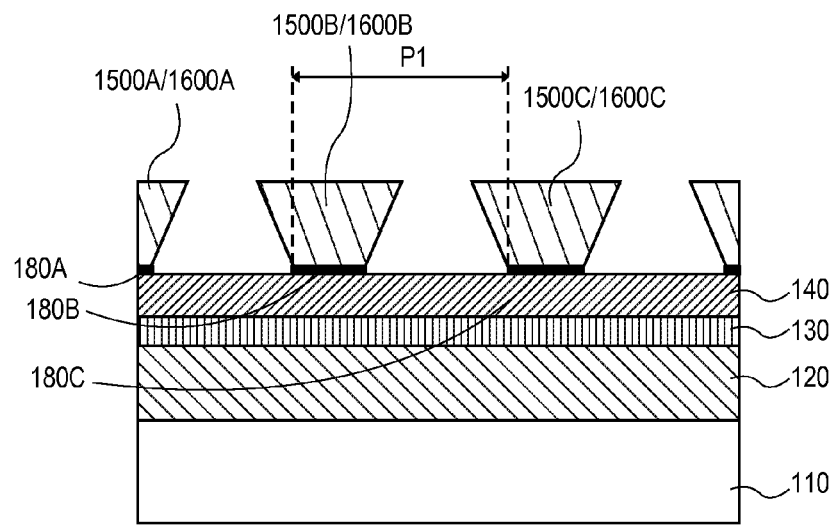
FIG. 15 shows a side view an embodiment of a portion of an integrated circuit structure including a base substrate, a hard mask layer, two substrate layers and patterned discreet structures of photoresist material wherein, before the photoresist layer is deposited and the discreet structures are formed, an exposed surface of the second substrate layer is modified at base positions for the discreet structures.

One alternative to using patterned discreet structures as a mask for etching substrate layer 130 and substrate layer 140 is to use surface modification of substrate layers using the discreet structures to create a mask for which the substrate layers may be modified. Such technique is described in reference to FIGS. 15-17. Referring to FIG. 15, in this embodiment, before discreet structures 1500A/1600A, 1500B/1600B and 1500C/1600C are formed, an exposed surface of second substrate layer 140 may be modified at base positions for the discreet structures. Such areas 180A, 180B and 180C may be modified in the sense that future growth at such modified areas may be promoted over growth of material at unmodified areas. Such areas may be defined through a mask over the substrate and patterning to a pitch, P1, measured from a base of an edge of a first structure to a base of an edge of an adjacent second structure. Representative modification techniques include, but are not limited to, catalytic modification that allows for growth of a species (e.g., epitaxial growth) in designated areas or chemical modification that promotes directed self assembly in designated areas by, for example, desegregation of a phase of a material applied to the surface. Following the modification of areas in substrate layer 140, discreet structures 1500A/1600A, 1500B/1600B and 1500C/1600C may be formed according to techniques described with reference to FIGS. 2-7.

Figure 16:
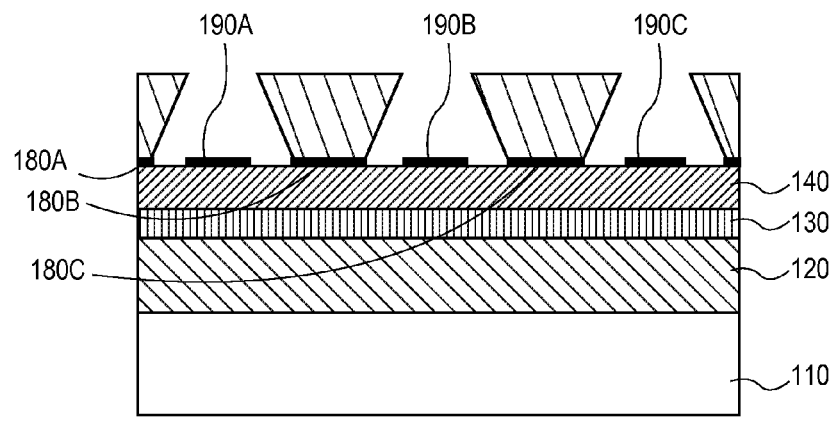
FIG. 16 shows the structure of FIG. 15 following the modification of the surface of the second substrate layer using the discreet structures as a pattern.
Figure 17:
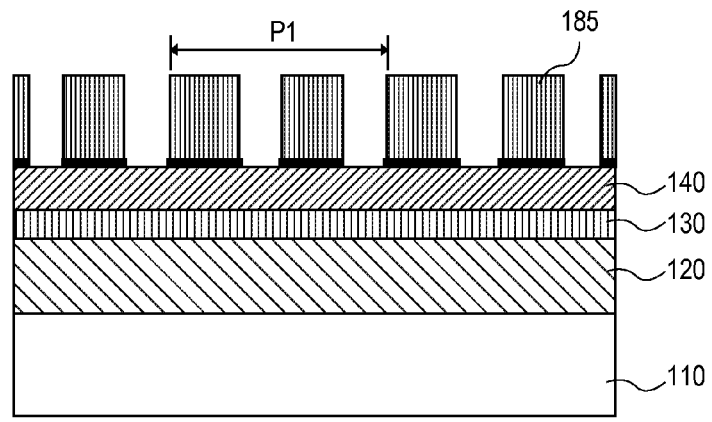
FIG. 17 shows the structure of FIG. 16 after the removal of the discreet structures and the formation of a patterned layer (patterned discreet structures) on the modified regions previously defined on the second substrate layer.

Following the formation of discreet structures 1500A/1600A, 1500B/1600B and 1500C/1600C on modified areas of substrate layer 140, the discreet structures may be used as a mask to pattern additional surface modification areas in second substrate layer 140. FIG. 16 shows surface modified areas 190A, 190B and 190C formed in substrate layer 140. Following the formation of surface modification areas 190A, 190B and 190C in substrate layer 140, discreet structures 1500A/1600A, 1500B/1600B and 1500C/1600C may be removed leaving second substrate layer 140 exposed with surface modification areas defined in its surface. FIG. 17 shows the structure after the removal of discreet structures 1500A/1600A, 1500B/1600B and 1500C/1600C and the growth of material 185 on modified areas 180A, 180B, 180C, 190A, 190B and 190C previously defined on substrate layer 140. Material 185 is, for example, an epitaxial grown material on a catalytically modified surface or a desegregated phase from a chemically modified surface, and forms a pattern on a surface of second substrate layer 140 FIG. 17 shows that the patterned structures of material 185 have a pitch that is twice the pitch of the initial pattern, P1.

Figure 18:
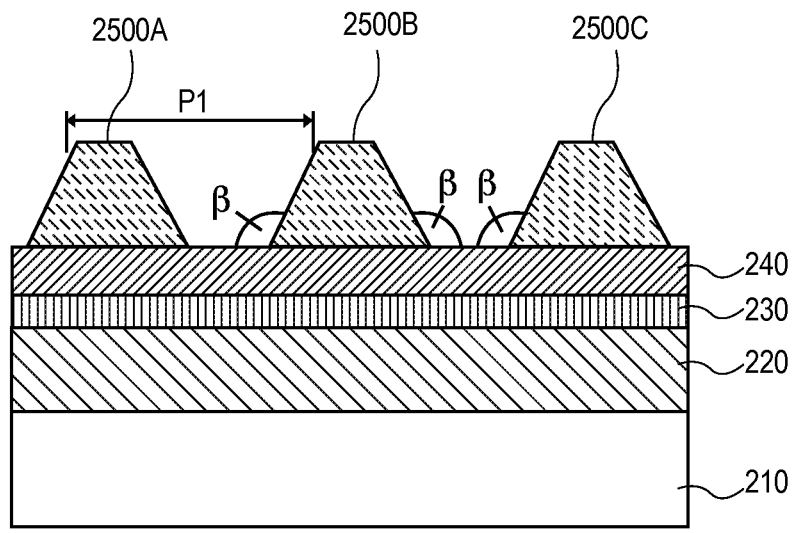
FIG. 18 shows a side view of another embodiment of a portion of an integrated circuit structure including a hard mask layer, two substrate layers and patterned discreet structures of photoresist material with each discreet structure having opposing side walls each defining an oblique angle greater than 90° with a surface of a substrate layer.

FIGS. 18-28 describe another embodiment of defining features for a structure. The method described is one of self-aligned angled side wall based triple patterning. Referring to FIG. 18, a side view of a portion of a structure is shown. In this embodiment, the structure includes base substrate 210 of, for example, a semiconductor material such as silicon. Overlying base substrate 210 is hard mask layer 220 of, for example, silicon nitride. Overlying hard mask layer 220 is first substrate layer 230 of, for example, a first antireflective material and overlying first substrate layer 230 is a second substrate layer 240 of, for example, a second antireflective material. On a surface of the structure, overlying second substrate layer 240 are discreet structures 2500A, 2500B and 2500C of, for example, a photoresist material. The structures shown have opposing side walls each having an oblique angle that is greater than 90 degrees relative to a surface of second substrate layer 240. As described with reference to FIG. 3 and FIGS. 6 and 7, the angled side walls may be formed directly by, for example, isotropic etch patterning (FIG. 3) or in a series involving anisotropic etch patterning followed by isotropic etch patterning (FIG. 6 and FIG. 7). Once formed, discreet structures 2500A, 2500B and 2500C have a pitch, P1, measured from a top edge of one structure to the same edge of an adjacent structure.

Figure 19:
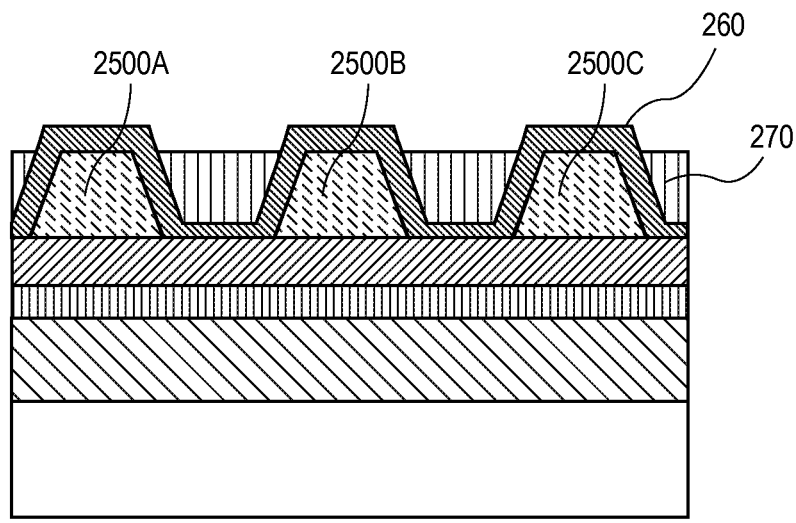
FIG. 19 shows the structure of FIG. 18 following the conformal patterning of a sacrificial layer over the discreet structures and introduction of a protective layer in a complementary manner.

FIG. 19 shows the structure of FIG. 18 following the conformal introduction of a sacrificial layer over the discreet structures. In one embodiment, sacrificial layer 260 is silicon oxide, deposited, for example, by chemical vapor deposition (CVD) to a thickness on the order of P1/6. Sacrificial layer 260 is described as conformal because it covers the surface of the structure and conforms to the surface of exposed second substrate layer 240 as well as to the side walls and exposed surface of discreet structures 2500A, 2500B and 2500C. Following the formation of sacrificial layer 260, protective layer 270 is complementarily introduced (e.g., deposited) on a surface of the structure. FIG. 19 shows protective layer 270 formed in a complementary fashion (complementary to discreet structures 2500A, 2500B and 2500C). One suitable protective layer material for protective layer 270 is silicon nitride.

Figure 20:
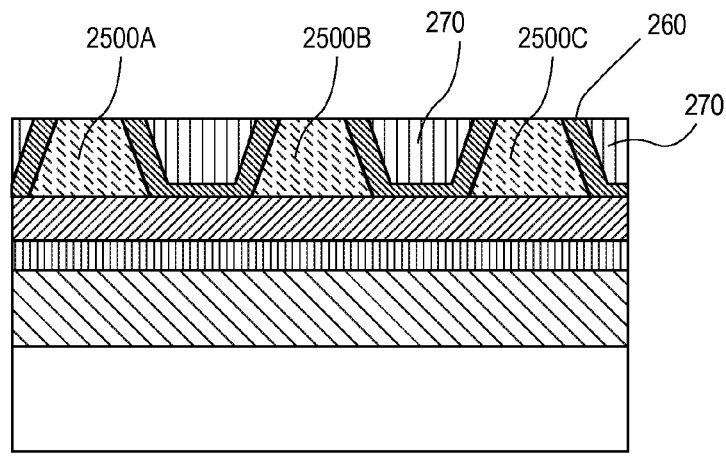
FIG. 20 shows the structure of FIG. 19 following the planarization of a superior surface of the structure to expose the discreet structures of photoresist material.

FIG. 20 shows the structure of FIG. 19 following the planarization of a superior surface of the composite structure. The planarization removes sacrificial layer on a superior surface of discreet structures 2500A, 2500B and 2500C as viewed so as to expose discreet structures 2500A, 2500B and 2500C. Planarization may be accomplished via chemical mechanical polish or etching.

Figure 21:
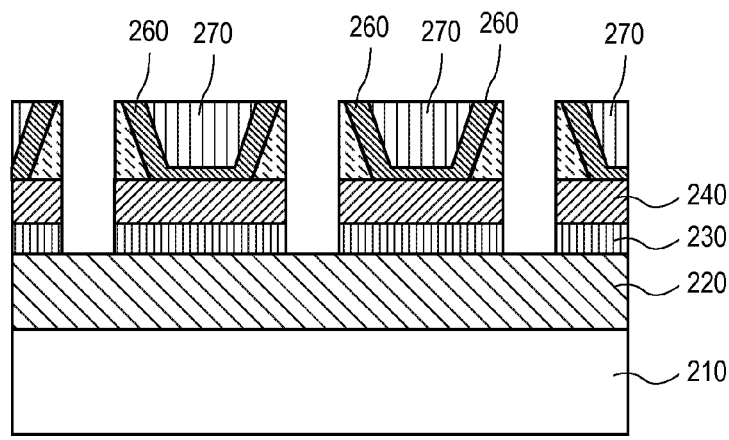
FIG. 21 shows the structure of FIG. 20 following anisotropic etching of portions of discreet structures and the substrate layer.

FIG. 21 shows the structure of FIG. 20 following an anisotropic etch of portions of discreet structures 2500A, 2500B and 2500C. In one embodiment, an etch chemistry for the anisotropic etch is selected that is selective for a material of discreet structures relative to a material of sacrificial layer 260 and a material of protective layer 270. In addition to removing portions of the discreet structures, the anisotropic etch proceeds through substrate layer 230 and substrate layer 240 to expose hard mask 220.

Figure 22:
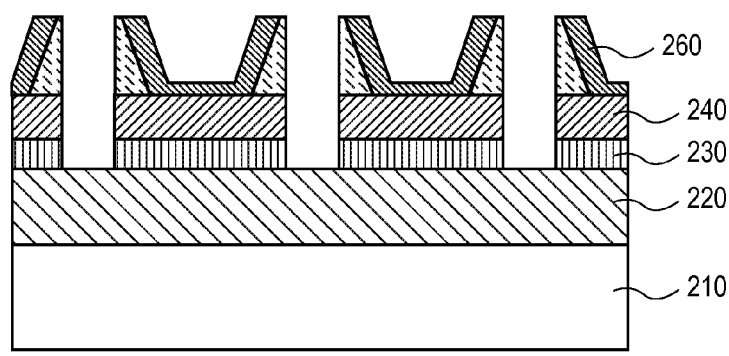
FIG. 22 shows the structure of FIG. 21 following the removal of the protective layer.

FIG. 22 shows the structure of FIG. 21 following the removal of the protective layer 270. Such removal may be accomplished by way of an etch selective for the protective layer material relative to a material of sacrificial layer 260 and a material of hard mask layer 200.

Figure 23:
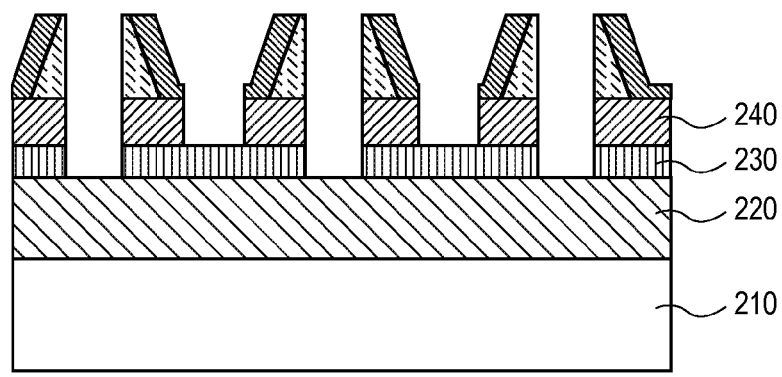
FIG. 23 shows the structure of FIG. 22 following an anisotropic etch of the sacrificial layer and the second substrate layer in areas protected only by the sacrificial layer.

FIG. 23 shows the structure of FIG. 22 following an anisotropic etch of sacrificial layer 260 and second substrate layer 240 in areas adjacent to discreet structures 2500A, 2500B, and 2500C.

Figure 24:
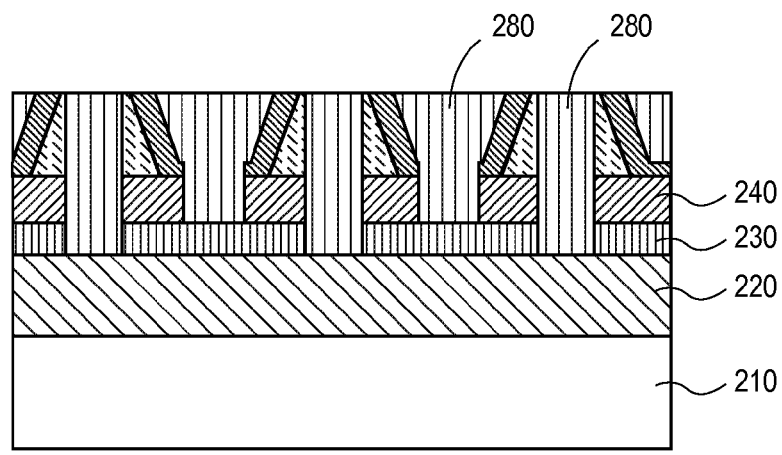
FIG. 24 shows the structure of FIG. 22 following the deposition of a protective layer over the structure in a complementary manner.

FIG. 24 shows the structure of FIG. 22 following the deposition of protective layer 280. In one embodiment, protective layer 280 is deposited by, for example, CVD over the substrate to fill the openings created by etches into the structure. One suitable material for protective layer 280 is, for example, silicon carbide.

Figure 25:
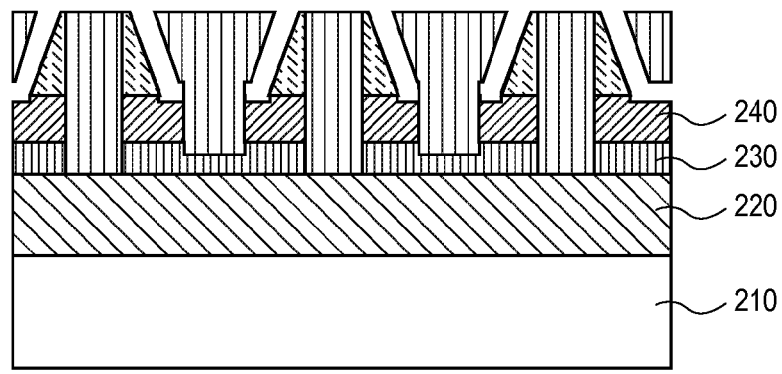
FIG. 25 shows the structure of FIG. 24 following the removal of the remaining sacrificial layer.

FIG. 25 shows the structure of FIG. 24 following the removal of the remaining sacrificial layer 260. An isotropic etch may be suitable to remove the material.

Figure 26:
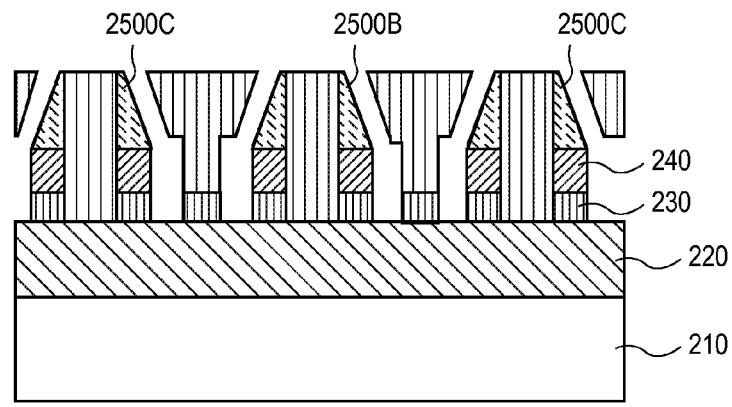
FIG. 26 shows the structure of FIG. 25 following the removal of material of second substrate layer and first substrate layer in areas defined by the previously removed sacrificial layer.

FIG. 26 shows the structure of FIG. 25 following the removal by, for example, etching second substrate layer 240 and first substrate layer 230 in areas defined by the previously removed sacrificial layer 260. In this case, the etch is selective for the substrate layers relative to the protective layer 280.

Figure 27:
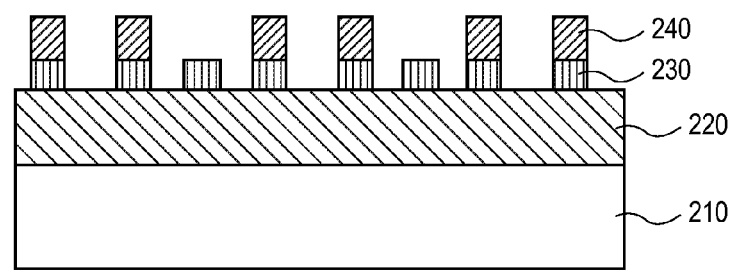
FIG. 27 shows the structure of FIG. 26 following the removal of the protective layer and the remaining portions of discreet structures of photoresist material.

FIG. 27 shows the structure of FIG. 26 following the removal by, for example, etching of protective layer 280 and the remaining portions of discreet structures 2500A, 2500B and 2500C. FIG. 27 shows patterned portions of first substrate layer 230 and second substrate 240 overlying the hard mask layer 220. It is appreciated that remaining portions of discreet structures 2500A, 2500B and 2500C could also be present but would not affect the pattern.

Figure 28:
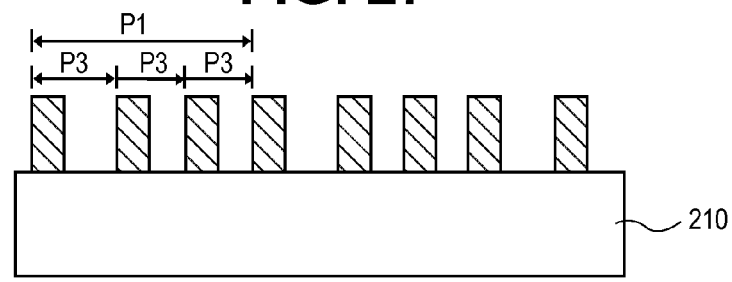
FIG. 28 shows the structure of FIG. 27 following the patterning of hard mask layer using the patterned structures formed of first substrate layer and second substrate layer.

FIG. 28 shows the structure following the patterning of hard mask layer 220 using the patterned structures formed of first substrate layer 230 and second substrate layer 240. According to this embodiment, hard mask layer 220 has a pitch, P3, that is one-third the pitch of the original pitch, P1.

Figure 29:
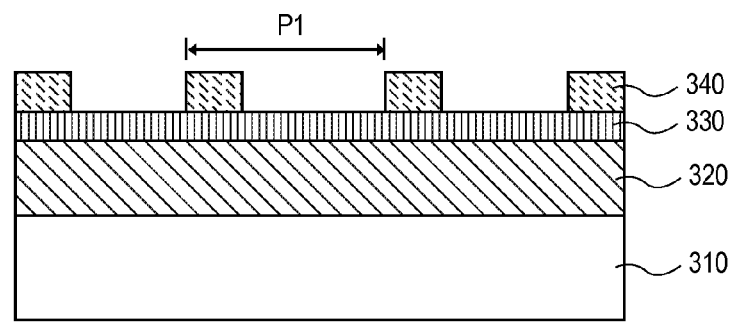
FIG. 29 shows a side view of an embodiment of a portion of an integrated circuit structure including a base substrate, a hard mask layer, a substrate layer and patterned discreet structures of photoresist material.

FIGS. 29-37 describe a method using self-aligned surface/volume modification to achieve triple the pitch patterning. Referring to FIG. 29, FIG. 29 shows a composite structure of substrate 310 of, for example, a silicon material. Overlying substrate 310 is hard mask layer 320 of, for example, silicon nitride. Overlying hard mask layer 320 is substrate layer 330 of, for example, an antireflective material. Overlying substrate layer 330 is photoresist layer 340. In the illustration shown in FIG. 29, photoresist layer 340 is patterned into discreet photoresist structures having a pitch, P1, between one edge of a side wall of a discreet photoresist structure and the same side wall edge of an adjacent structure. Opposing side walls of each structure are parallel to one another and are perpendicular to a surface of substrate layer 330.

Figure 30:
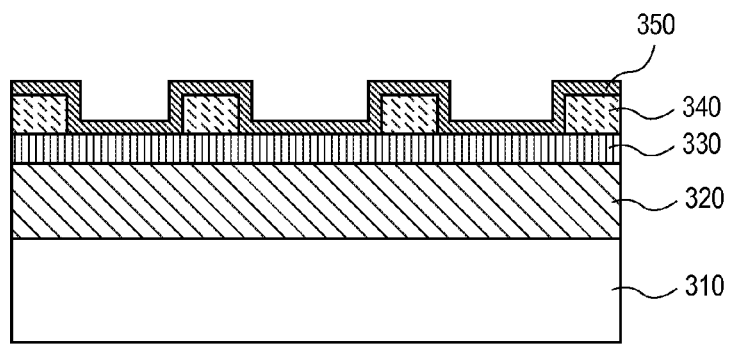
FIG. 30 shows the structure of FIG. 29 following the conformal introduction of a sacrificial layer.

FIG. 30 shows the structure of FIG. 29 following a conformal introduction of sacrificial layer 350. In one embodiment, sacrificial layer 350 is silicon oxide, that is, deposited by CVD to a thickness on the order of P1/6. By conformal deposition it is meant that sacrificial layer 350 conforms to the surface of exposed substrate layer 330 as well as to the side walls and superior surface (as viewed) of the discreet photoresist structures formed of photoresist layer 340.

Figure 31:
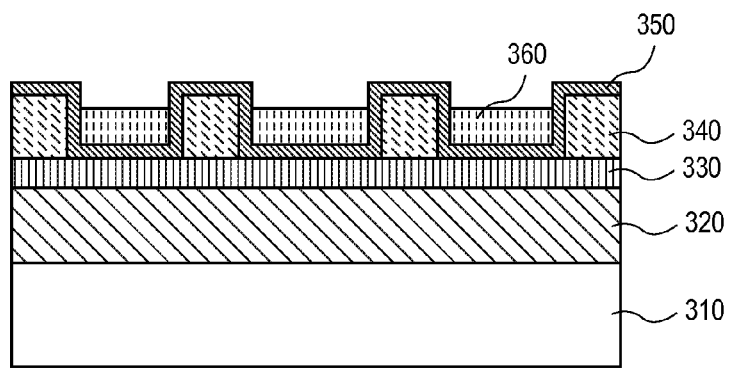
FIG. 31 shows the structure of FIG. 30 following the complementary deposition of a second modifiable material on the structure.

FIG. 31 shows the structure of FIG. 30 following the complementary introduction of second photoresist 360 or any other modifiable material. In this embodiment, photoresist material 360 is deposited between the discreet photoresist structures defined by photoresist layer 340. One way this may be done is, for example, by a spin coating deposition over the structure including over discreet structures of photoresist layer 340 and sacrificial layer 350 followed by removal (e.g., a planarization polish or an oxygen ashing) to remove second photoresist material 360 from a superior surface of the discreet structures of photoresist layer 340 (a removal from the top surface as viewed). In one embodiment, sacrificial layer 350 on discreet structures of photoresist layer 340 will be used to shadow an angled introduction of a modifying species into second photoresist material 360. Accordingly, in one embodiment, a height (measured, for example, from substrate layer 330) of the discreet structures with sacrificial layer 360 is greater than a height (a thickness) of second photoresist material 360.

Figure 32:
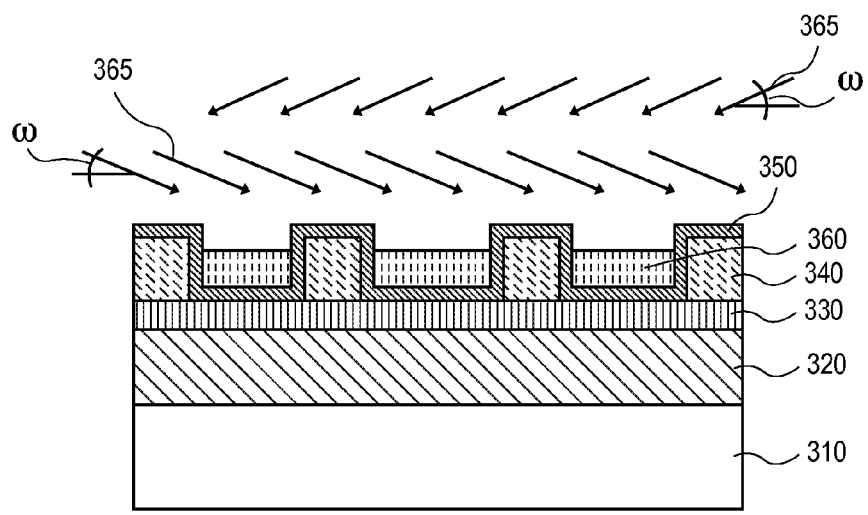
FIG. 32 shows the structure of FIG. 31 undergoing an oblique angle modification.

FIG. 32 shows the structure of FIG. 31 undergoing an oblique angle modification. In this manner, an implant of a modifying species is introduced to change a property of a material of second photoresist material 360. Representatively, a modifying species such as high energy ions, electrons, or photons may be introduced into a positive photoresist material to change the property of the material. Referring to FIG. 32, the implanted materials are introduced at an angle, ω. FIG. 32 shows a first implant of modifying species into second photoresist layer 360 from the left as viewed (left to right) and a second implant of the same species from the right (right to left). Referring to FIG. 32, FIG. 32 shows modifying species 365 being introduced at oblique angle ω from opposite sides of the structure. In one embodiment, angle, ω, is selected such that it is less than 90 degrees relative to the superior surface of the structure. A representative angle is on the order of 45°. A depth or thickness of photoresist material 360 is selected such that side wall structures defined by photoresist layer 340 and sacrificial layer 350 shadow, interfere or block a portion of the introduction of species 365.

Figure 33:
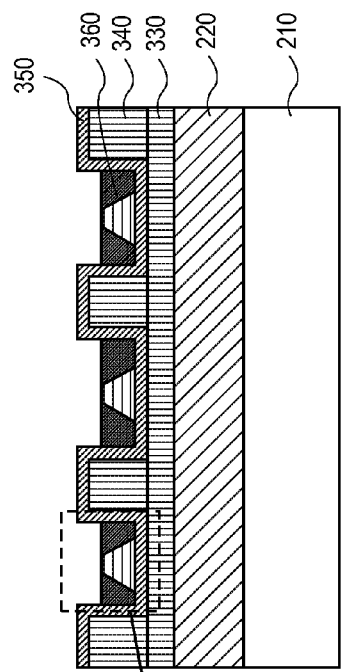
FIG. 33 shows the structure of FIG. 32 following the introduction of a modifying species into the second photoresist material.

FIG. 33 shows the structure of FIG. 32 following the introduction of modifying species 365 into second photoresist layer 360. As illustrated, modifying species 365 modifies a property of second photoresist layer 360. In one embodiment, modifying species 365 modifies second photoresist layer 360 such that modified portions of second photoresist material 360, following modification, includes modified regions 3600A and unmodified region 3600B. The demarcation between the modified and unmodified regions forms an angle, θ, that is less than 90 degrees relative to the composite structure (a horizontal surface of sacrificial layer 350 as viewed). A representative angle θ is on the order of 45°.

Figure 34:
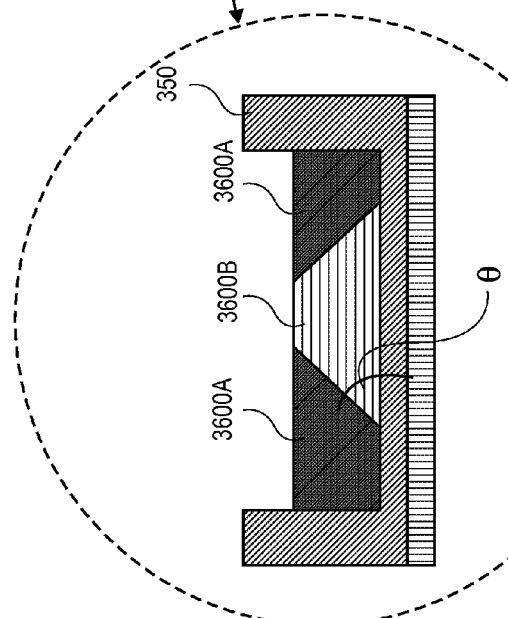
FIG. 34 shows the structure of FIG. 33 following the removal of the unmodified portion of the second photoresist material.
Figure 34:
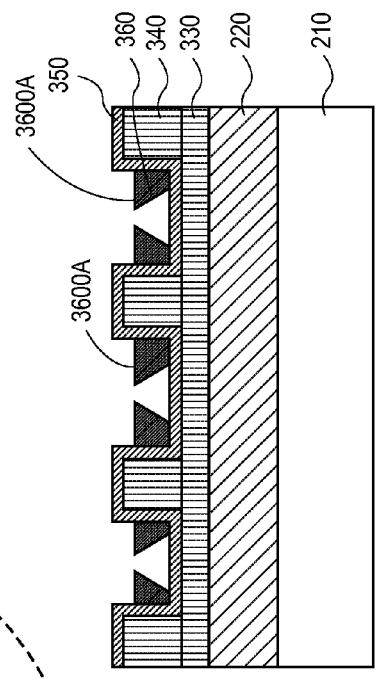

FIG. 34 shows the structure of FIG. 33 following the removal of unmodified portion 3600B of second photoresist material 360. One way to remove unmodified region 3600B is by, for example, an oxygen ashing. FIG. 34 shows the structure following the removal of the unmodified portions 3600B.

Figure 35:
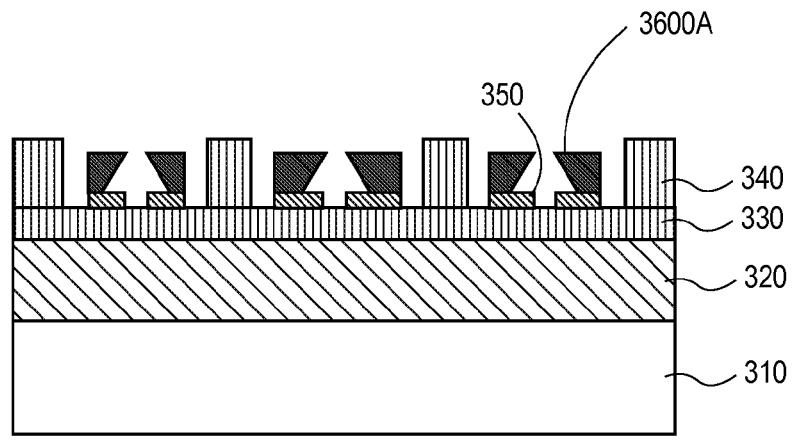
FIG. 35 shows the structure of FIG. 34 following the selective removal of a portion of the sacrificial layer by an anisotropic etch.

FIG. 35 shows the structure of FIG. 34 following the selective removal of a portion of sacrificial layer 350 by an anisotropic etch. In this manner, portions of sacrificial layer 350 protected by modified photoresist regions 3600A are not removed. The discreet structures of photoresist layer 340 and of modified photoresist portions 3600A define a pattern on the structure.

Figure 36:
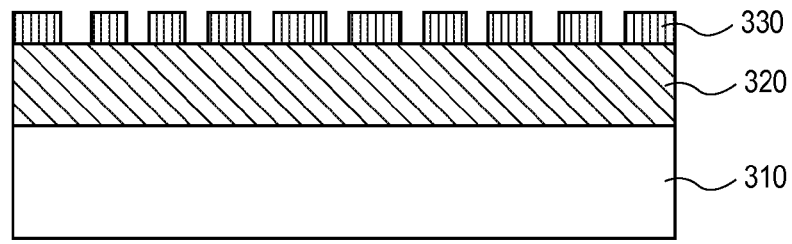
FIG. 36 shows the structure of FIG. 35 following the patterning of the second substrate layer and the removal of the pattern.
Figure 37:
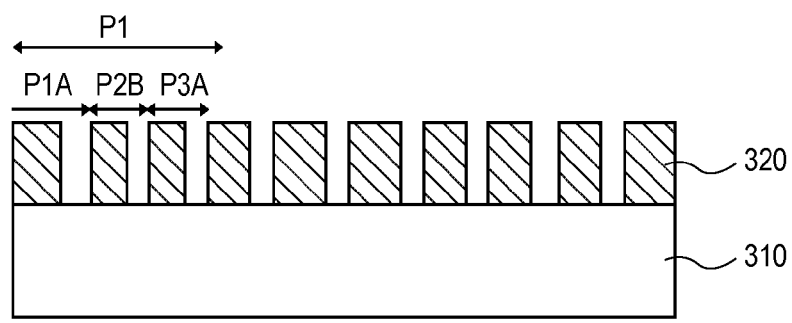
FIG. 37 shows the structure of FIG. 36 following the patterning of hard mask layer using the pattern in the second substrate layer and the removal of the pattern.

FIG. 36 shows the structure of FIG. 35 following the etching of second substrate layer 330 using the pattern from FIG. 35 of photoresist layer 340 and modified photoresist regions 3600A. FIG. 36 also shows the structure after removal of the pattern. Finally, FIG. 37 shows the structure following the patterning of hard mask layer 320 to define discreet structures. As shown, the pitch of the structures is triple the initial pitch P1.

Figure 38:
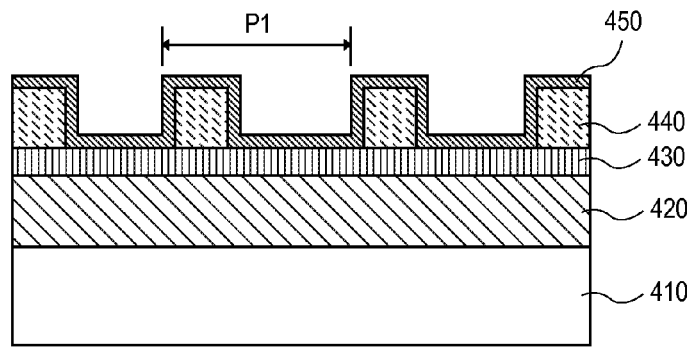
FIG. 38 shows a side view of another embodiment of a portion of an integrated structure including a base substrate, and hard mask layer, a first substrate layer, patterned and discreet structures of a first photoresist material and a conformal sacrificial layer on a superior surface.

FIGS. 38-45 show a self-aligned angled surface/body modification based quadruple patterning technique. Referring to FIG. 38, in one embodiment, the composite structure includes semiconductor or other substrate 410 onto a surface of which is added hard mask layer 420 and substrate layer 430. Hard mask layer 420 is, for example, of silicon nitride. Substrate layer 420 is, for example, of antireflective material. Overlying second substrate layer 430 is patterned photoresist layer 440 which defines a primary pattern having a pitch, P1, between similar side walls of adjacent discreet photoresist structures. Although described as a pattern of photoresist structures, it is appreciated that the primary pattern can be defined into a photoresist or transferred into another material. Overlying the discreet structures of first photoresist layer 440 is sacrificial layer 450 of, for example, silicon oxide. Sacrificial layer 450 is conformal in the sense that it covers both the side walls and the surface of discreet structures of photoresist layer 440 as well as a surface of the composite structure (over a surface of second substrate layer 430) of the composite structure.

Figure 39:
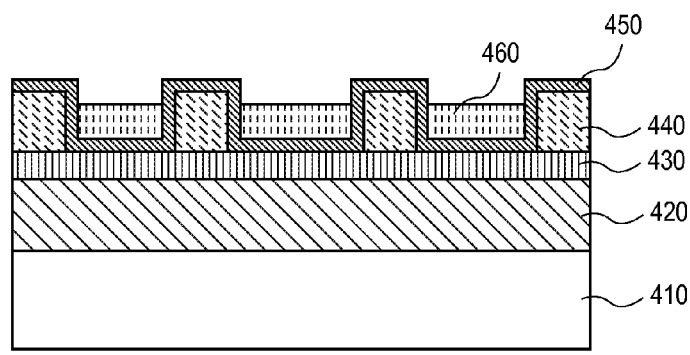
FIG. 39 shows the structure of FIG. 38 following the introduction of a second modifiable material in a complementary manner on a surface of the structure.

FIG. 39 shows the structure of FIG. 38 following the deposition of second photoresist layer 460 or other modifiable material in a complementary fashion. In one embodiment, second photoresist layer 460 may be a material similar to first photoresist layer 440 (e.g. both a positive photo resist). In this embodiment, second photoresist layer 460 is deposited to a thickness less than a thickness of first photoresist layer 440 so that side wall portions of sacrificial layer 450 are exposed.

Figure 40:
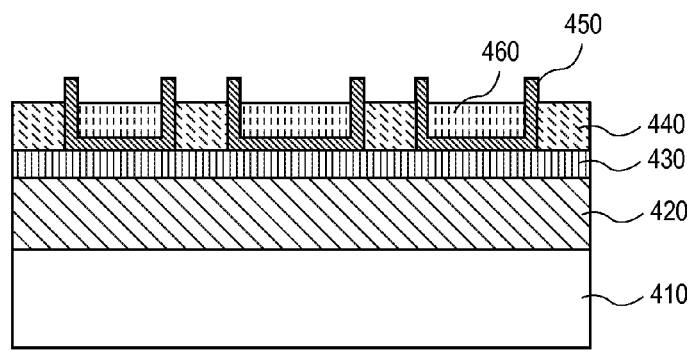
FIG. 40 shows the structure of FIG. 39 following an anisotropic etch of the sacrificial layer and removal of a portion of the first photoresist material.

FIG. 40 shows the structure of FIG. 39 following an anisotropic etch of sacrificial layer 450. The anisotropic etch continues until that portion of sacrificial layer 450 overlying a surface of the discreet structures defined by first photoresist layer 440 are removed and proceeds partially into the discreet structures of the photoresist layer 440 until the layers have a similar thickness to a thickness of second photoresist layer 460. In this manner, discreet side wall portions of sacrificial layer 450 will protrude from a surface of the composite structure and act as screens to a subsequent angled implant.

Figure 41:
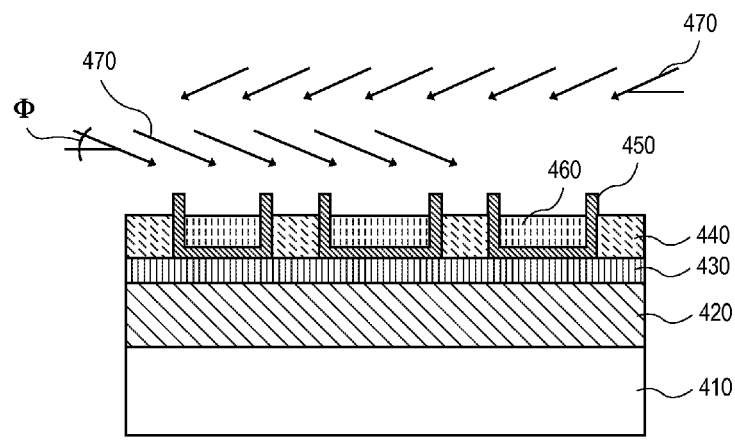
FIG. 41 shows the structure of FIG. 40 undergoing an oblique angle modification.

FIG. 41 shows the structure of FIG. 40 undergoing an oblique angle modification. In this manner, an implant of a modifying species is introduced to change a property of a material of first photoresist layer 440 and a material of second photoresist layer 460. As shown, an implant of modifying, for example, ions, photons, or electrons is introduced at an angle φ from both the left and the right side of the structure as viewed. A representative oblique angle, φ, is 45°. Protruding portions of sacrificial layer 450 act as screens to block modifying species 470 from reaching portions of first photoresist layer 440 and second photoresist layer 460.

Figure 42:
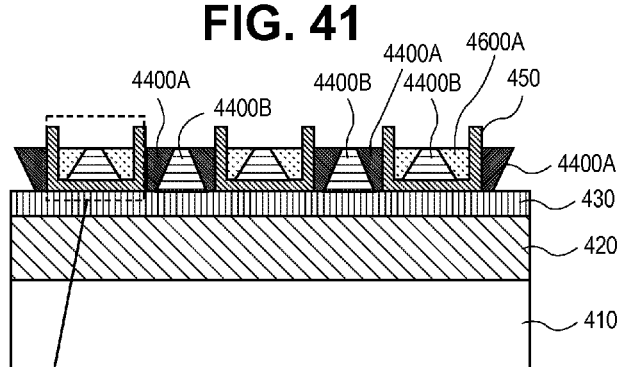
FIG. 42 shows the structure of FIG. 41 following the introduction of a modifying species into the first and second photoresist material.
Figure 42:
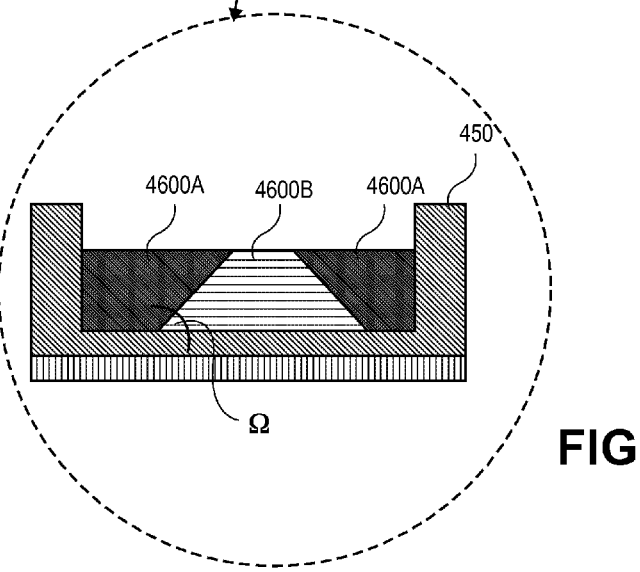

FIG. 42 shows the structure of FIG. 41 following the modification of first photoresist layer 440 and second photoresist layer 460. As viewed, first photoresist layer 440 is modified into modified portions 4400A and unmodified portions 4400B and second photoresist layer 460 is modified into modified portions 4600A and unmodified portions 4600B, with the differentiation between the modified and unmodified portions defining an oblique angle Ω, relative to the surface of the composite structure (relative to a horizontal surface of sacrificial layer 450 as viewed). An inset of FIG. 42 shows the angle Ω is less than 90° (e.g., 45°).

Figure 43:
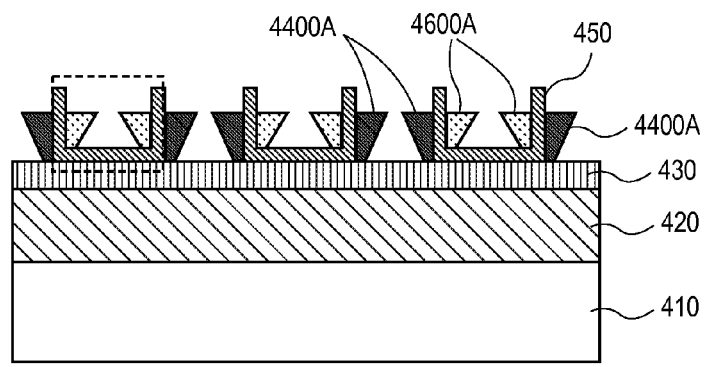
FIG. 43 shows the structure of FIG. 42 following the removal of unmodified portions of the first and second photoresist material.
Figure 44:
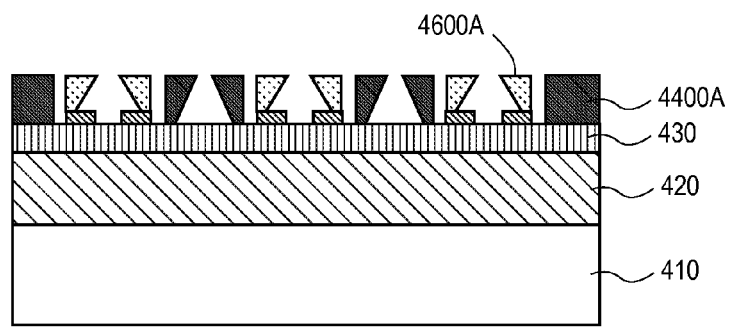
FIG. 44 shows the structure of FIG. 43 following the removal of a portion of the sacrificial layer.
Figure 45:
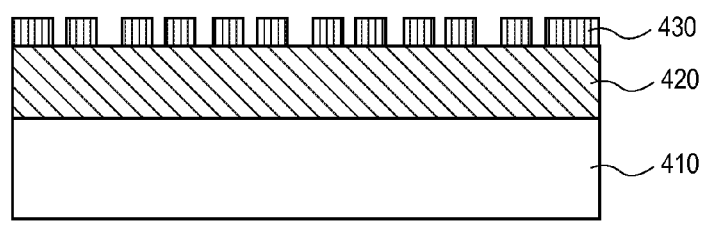
FIG. 45 shows the structure of FIG. 44 following the patterning of the first substrate layer and a removal of the pattern.
Figure 46:
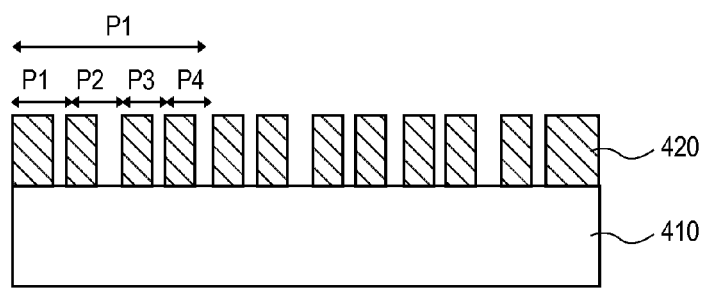
FIG. 46 shows the structure of FIG. 45 following the patterning of the hard mask layer using the pattern defined in the substrate layer and removal of the pattern.

FIG. 43 shows the structure of FIG. 42 following the removal of unmodified portions 4400B and 4600B by, for example, oxygen ashing. FIG. 44 shows the structure of FIG. 43 following an anisotropic etch to remove the exposed portions of sacrificial layer 450. An etch chemistry for anisotropic etch is selected to be selective for a material of sacrificial layer 450 relative to a material for modified portions of first photoresist layer 440 and second photoresist layer 460 and relative to substrate layer 430. FIG. 45 shows the structure following an etch using the remaining pattern into substrate layer 430 and the removal of modified photoresist portions 4400A and 4600A as well as the removal of the remaining portions of sacrificial layer 450. FIG. 46 shows the patterning of first substrate layer 420 using the pattern defined in substrate layer 430. As shown, the discreet structures formed in first substrate layer 420 have a pitch one-fourth the initial pitch, P1. FIG. 41 showed a bidirectional oblique angle modification with a modifying species introduced from both a left side and a right side of the structure (as viewed) to change a property of a material of first photoresist layer 440 and a material of second photoresist layer 460. It is appreciated that a larger pitch such as at least one half the initial pitch, P1, may be achieved using the same method but using a unidirectional oblique angle modification (e.g., left or right) with a modifying species to change a property of a material of first photoresist layer 440 and a material of second photoresist layer 460.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The invention claimed is:

1. A method comprising:
    forming a pattern on a surface of a substrate, the pattern comprising one of discrete structures comprising at least one sidewall defining an oblique angle relative to the surface and discrete structures complemented with a material layer therebetween, the material layer comprising a volume modified into distinct regions separated by at least one oblique angle relative to the surface; and
    defining circuit features on the substrate using the pattern, the features having a pitch less than a pitch of the pattern.

2. The method of claim 1, wherein the pattern comprises the discrete structures complemented with the modified material layer, and defining the circuit features comprises selectively etching the discrete structures and the modified material layer.

3. The method of claim 1, wherein the pitch of the circuit features is one-half the pitch of the pattern.

4. The method of claim 1, wherein the pitch of the circuit features is one-third the pitch of the pattern.

5. The method of claim 1, wherein the pitch of the circuit features is one-fourth the pitch of the pattern.

6. The method of claim 1, wherein the surface of the substrate comprises a feature layer and overlying the feature layer is a first sacrificial substrate layer and a second sacrificial substrate layer and the pattern comprises the discrete structures comprising at least one sidewall defining an oblique angle and is formed on the second substrate layer and, defining features on the substrate comprises forming differentiated regions in the first sacrificial substrate layer and the second sacrificial substrate layer and, after forming the differentiated regions in the first sacrificial substrate layer and the second sacrificial substrate layer, defining circuit features in the feature layer having a pitch less than a pitch of the pattern through a series of selective etches.

7. The method of claim 1, wherein the pattern comprises free standing structures on the surface of the substrate comprising a pair of opposing sidewalls each defining an oblique angle relative to the surface that is less than 90 degrees.

8. The method of claim 7, wherein the surface of the substrate comprises a feature layer and the pattern is formed over a plurality of sacrificial layers overlying the feature layer, the method further comprising defining circuit features in the feature layer having a pitch less than a pitch of the pattern through a series of selective etches of the plurality of sacrificial layers.

9. The method of claim 1, wherein the pattern comprises the discrete structures comprising at least one sidewall defining an oblique angle and after forming the pattern, depositing a sacrificial material on the surface of the substrate that is complementary to the pattern, and defining circuit features on the substrate comprises defining circuit features having a pitch that is one-third the pitch of the pattern by selectively etching the pattern and the second sacrificial material.

10. The method of claim 1, wherein the pattern is a second pattern, and prior to forming the second pattern, the method comprises forming a first pattern comprising discrete structures on the surface of the substrate and forming the second pattern comprises depositing a second pattern material complementary to the first pattern and modifying a portion of the volume of the second pattern material, and defining circuit features on the substrate comprises defining circuit features having a pitch that is one-third or one-fourth a pitch of the first pattern by selectively etching the first pattern and the second pattern material.

* * * * *